United States Patent
Ufert

(10) Patent No.: US 8,038,850 B2
(45) Date of Patent: Oct. 18, 2011

(54) SPUTTER DEPOSITION METHOD FOR FORMING INTEGRATED CIRCUIT

(75) Inventor: Klaus Ufert, Unterschleißheim (DE)

(73) Assignee: Qimonda AG, Munich (DE)

( * ) Notice: Subject to any disclaimer, the term of this patent is extended or adjusted under 35 U.S.C. 154(b) by 1125 days.

(21) Appl. No.: 11/473,441

(22) Filed: Jun. 23, 2006

(65) Prior Publication Data

US 2007/0295597 A1   Dec. 27, 2007

(51) Int. Cl.
*C23C 14/35*   (2006.01)

(52) U.S. Cl. ......... 204/192.12; 204/298.11; 204/298.14; 204/298.15; 204/298.16; 204/298.06; 204/192.17

(58) Field of Classification Search .............. 204/298.06, 204/298.08, 298.11, 298.14, 298.15, 298.16, 204/298.26, 192.12, 192.17; 118/728
See application file for complete search history.

(56) References Cited

U.S. PATENT DOCUMENTS

| | | | | |
|---|---|---|---|---|
| 4,427,524 A | * | 1/1984 | Crombeen et al. | 204/298.06 |
| 4,897,171 A | * | 1/1990 | Ohmi | 204/298.15 |
| 4,931,158 A | | 6/1990 | Bunshah et al. | |
| 4,988,422 A | * | 1/1991 | Wirz | 204/192.15 |
| 5,006,219 A | * | 4/1991 | Latz et al. | 204/298.16 |
| 5,178,739 A | * | 1/1993 | Barnes et al. | 204/192.12 |
| 5,234,560 A | * | 8/1993 | Kadlec et al. | 204/192.12 |
| 5,298,720 A | * | 3/1994 | Cuomo et al. | 219/121.43 |
| 6,182,602 B1 | | 2/2001 | Redeker et al. | |
| 6,228,438 B1 | * | 5/2001 | Schmitt | 427/569 |
| 6,238,527 B1 | * | 5/2001 | Sone et al. | 204/192.12 |
| 6,361,667 B1 | * | 3/2002 | Kobayashi et al. | 204/298.11 |
| 6,783,634 B2 | * | 8/2004 | Nozawa et al. | 204/192.1 |
| 2003/0052330 A1 | | 3/2003 | Klein | |
| 2003/0070914 A1 | | 4/2003 | Hong et al. | |
| 2004/0965805 | | 5/2004 | Hahakura et al. | |
| 2004/0159828 A1 | * | 8/2004 | Rinerson et al. | 257/2 |
| 2004/0233608 A1 | | 11/2004 | Brcka | |
| 2006/0068528 A1 | | 3/2006 | Ufert | |

FOREIGN PATENT DOCUMENTS

| | | |
|---|---|---|
| EP | 0618606 A1 | 10/1994 |
| EP | 0732728 A2 | 9/1996 |
| WO | 0058994 | 10/2000 |
| WO | 2004050944 A2 | 6/2004 |

* cited by examiner

*Primary Examiner* — Rodney McDonald
(74) *Attorney, Agent, or Firm* — Dicke, Billig & Czaja, PLLC

(57) ABSTRACT

A sputter deposition apparatus and method, and a substrate holder for use with a sputter deposition apparatus is disclosed. According to one embodiment of the invention, a sputter deposition apparatus is provided, including at least one sputter target, a first plasma, a substrate holder, and a further plasma. In one embodiment, the further plasma is an ECWR plasma. According to an additional embodiment of the invention, an anode is provided between the further plasma, and the substrate holder. According to a further embodiment, the substrate holder includes a dielectric layer with varying thickness.

42 Claims, 7 Drawing Sheets

SPUTTER DEPOSITION METHOD FOR FORMING INTEGRATED CIRCUIT

BACKGROUND

The invention relates to a sputter deposition apparatus and method, in particular for use for the fabrication of memory devices, e.g., resistively switching memory devices such as Phase Change Random Access Memories ("PCRAMs"), Conductive Bridging Random Access Memories ("CBRAMs"), etc. Further, the invention relates to a substrate holder for use with a sputter deposition apparatus.

In the case of conventional memory devices, in particular conventional semiconductor memory devices, one differentiates between functional memory devices (e.g., PLAs, PALs, etc.), and table memory devices, e.g., ROM devices (ROM=Read Only Memory—in particular PROMs, EPROMs, EEPROMs, flash memories, etc.), and RAM devices (RAM=Random Access Memory—in particular e.g., DRAMs and SRAMs).

A RAM device is a memory for storing data under a predetermined address and for reading out the data under this address later. In the case of SRAMs (SRAM=Static Random Access Memory), the individual memory cells consist e.g., of few, for instance 6, transistors, and in the case of DRAMs (DRAM=Dynamic Random Access Memory) in general only of one single, correspondingly controlled capacitive element.

Furthermore, "resistive" or "resistively switching" memory devices have also become known recently, e.g., Phase Change Random Access Memories ("PCRAMs"), Conductive Bridging Random Access Memories ("CBRAMs"), etc., etc.

In the case of "resistive" or "resistively switching" memory devices, an "active" or "switching active" material—which is, for instance, positioned between two appropriate electrodes—is placed, by appropriate switching processes, in a more or less conductive state (wherein e.g., the more conductive state corresponds to a stored logic "One", and the less conductive state to a stored logic "Zero", or vice versa).

In the case of Phase Change Random Access Memories (PCRAMs), for instance, an appropriate chalcogenide or chalcogenide compound material may be used as a "switching active" material (e.g., a Ge—Sb—Te ("GST") or an Ag—In—Sb—Te compound material, etc.). The chalcogenide compound material is adapted to be placed in an amorphous, i.e. a relatively weakly conductive, or a crystalline, i.e. a relatively strongly conductive state by appropriate switching processes (wherein e.g., the relatively strongly conductive state may correspond to a stored logic "One", and the relatively weakly conductive state may correspond to a stored logic "Zero", or vice versa). Phase change memory cells are, for instance, known from G. Wicker, "Nonvolatile, High Density, High Performance Phase Change Memory", SPIE Conference on Electronics and Structures for MEMS, Vol. 3891, Queensland, 2, 1999, and e.g., from Y. N. Hwang et al., "Completely CMOS Compatible Phase Change Nonvolatile RAM Using NMOS Cell Transistors", IEEE Proceedings of the Nonvolatile Semiconductor Memory Workshop, Monterey, 91, 2003, S. Lai et al., "OUM-a 180 nm nonvolatile memory cell element technology for stand alone and embedded applications", IEDM 2001, Y. Ha et al., "An edge contact type cell for phase change RAM featuring very low power consumption", VLSI 2003, H. Horii et al., "A novel cell technology using N-doped GeSbTe films for phase change RAM", VLSI 2003, Y. Hwang et al., "Full integration and reliability evaluation of phase-change RAM based on 0.24 μm-CMOS technologies", VLSI 2003, and S. Ahn et al., "Highly Manufacturable High Density Phase Change Memory of 64 Mb and beyond", IEDM 2004, etc.

In the case of the above Conductive Bridging Random Access Memories (CBRAMs), the storing of data is performed by use of a switching mechanism based on the statistical bridging of multiple metal rich precipitates in the "switching active" material. Upon application of a write pulse (positive pulse) to two respective electrodes in contact with the "switching active" material, the precipitates grow in density until they eventually touch each other, forming a conductive bridge through the "switching active" material, which results in a high-conductive state of the respective CBRAM memory cell. By applying a negative pulse to the respective electrodes, this process can be reversed, hence switching the CBRAM memory cell back in its low-conductive state. Such memory components are, e.g., disclosed in Y. Hirose, H. Hirose, J. Appl. Phys. 47, 2767 (1975), T. Kawaguchi et al., "Optical, electrical and structural properties of amorphous Ag—Ge—S and Ag—Ge—Se films and comparison of photoinduced and thermally induced phenomena of both systems", J. Appl. Phys. 79 (12), 9096, 1996, M. Kawasaki et al., "Ionic conductivity of $Agx(GeSe3)1-x$ ($0<x0.571$) glasses", Solid State Ionics 123, 259, 1999, etc.

Correspondingly similar as is the case for the above PCRAMs, for CBRAM memory cells an appropriate chalcogenide or chalcogenid compound (for instance GeSe, GeS, AgSe, CuS, etc.) may be used as "switching active" material.

Further, for the above electrodes e.g., Cu, Ag, Au, Zn, etc. may be used (or, e.g., Cu, Ag, Au, Zn, etc. for a respective first, and, e.g., W, Ti, Ta, TiN, etc. for a respective second electrode, etc.).

For the fabrication of memory devices, e.g., depositing the above switching active material, electrodes, etc. sputter deposition methods are used.

Sputtering is a physical process whereby atoms in a solid "target material" are ejected into the gas phase due to bombardment of the material by e.g., energetic ions. The ejected atoms then are deposited on a respective substrate. The ions for the sputtering are e.g., supplied by a plasma generated in the respective sputtering apparatus. However, deposition of the sputtered material also occurs on side wall surfaces of the sputtering apparatus. Lighter components of the sputtered material are subjected to such deposition to a higher degree than heavier components of the sputtered material. Hence, the material finally deposited on the substrate tends to not have the desired composition, especially in outer peripheral edge regions of the substrate. Consequently, a sputter deposition apparatus and method is desirable with which a homogeneous deposition of the sputtered material might be achieved.

For these or other reasons, there is a need for the present invention.

SUMMARY

The present invention provides a sputter deposition apparatus and method. According to an embodiment of the invention, a sputter deposition apparatus is provided, including: at least one sputter target, a first plasma, a substrate holder, and a further plasma. In one embodiment, the further plasma is an ECWR plasma. According to another embodiment of the invention, an anode is provided between the further plasma, and the substrate holder. According to another embodiment, the substrate holder includes a dielectric layer with varying thickness.

BRIEF DESCRIPTION OF THE DRAWINGS

The accompanying drawings are included to provide a further understanding of the present invention and are incordrawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
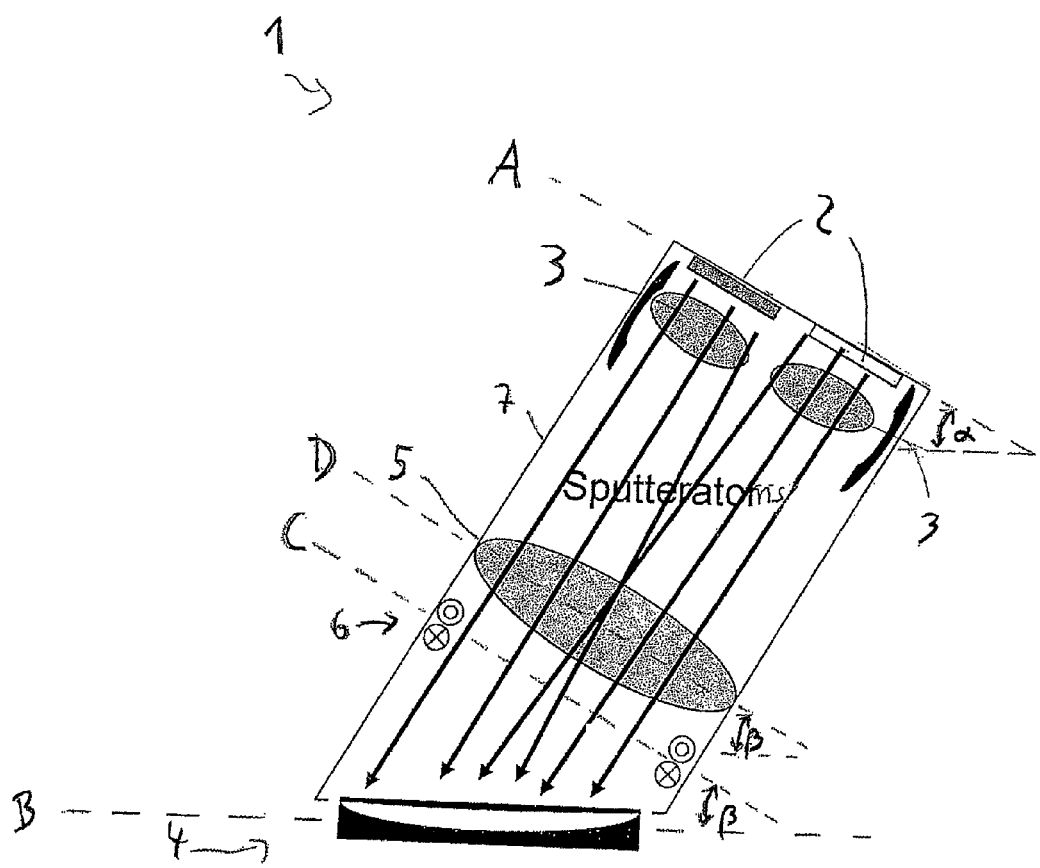
FIG. 1 illustrates a schematic cross-sectional view of a sputter deposition apparatus in accordance with an embodiment of the present invention.

FIG. 1 illustrates a schematic cross-sectional view of a sputter deposition apparatus 1 in accordance with one embodiment of the present invention.

Figure 2:
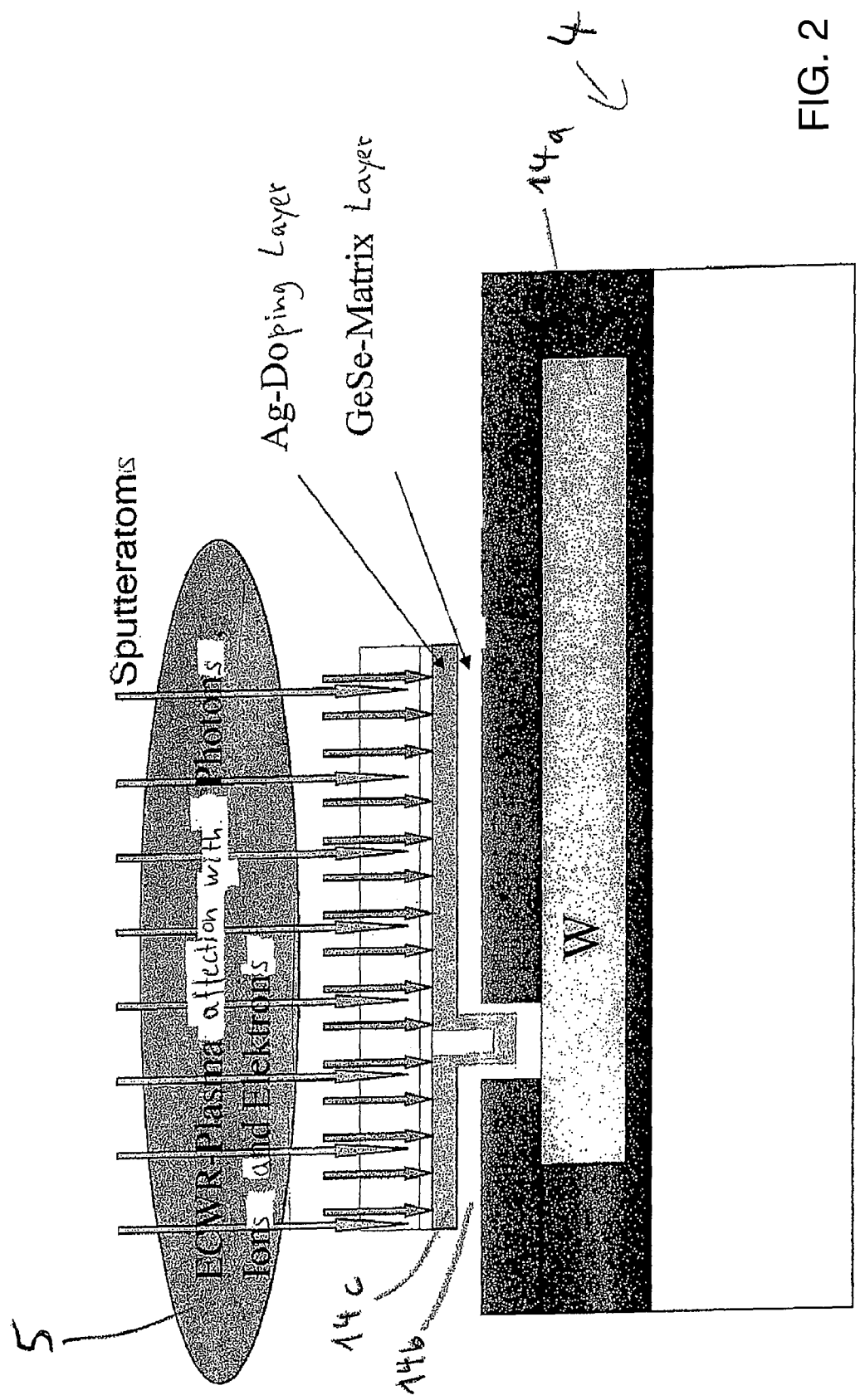
FIG. 2 illustrates a schematic representation of the ECWR plasma generated in the sputter deposition apparatus illustrated in FIG. 1, and respective layers deposited on the substrate provided in the apparatus.

The sputter deposition apparatus 1 might be used for any kind of deposition procedure, and is particularly useful for the fabrication of semiconductor devices and/or memory devices such as ROMs, PROMs, EPROMs, EEPROMs, flash memories, RAMs (e.g., DRAMs, SRAMs, etc.), in particular for the fabrication of "resistive" or "resistively switching" memory devices such as Phase Change Random Access Memories ("PCRAMs"), Conductive Bridging Random Access Memories ("CBRAMs"), etc. In particular, the deposition apparatus 1 might be used for the fabrication of the respective "switching active" material of a "resistive" or "resistively switching" memory device (e.g., a respective chalcogenide or chalcogenid compound material, e.g., a Ge—Sb—Te ("GST") or an Ag—In—Sb—Te compound material (or GeSe, GeS, GeS2, AgSe, CuS, etc.)). Alternatively or in addition, the deposition apparatus 1 might e.g., be used for the fabrication of a respective (first and/or second) electrode of a "resistive" or "resistively switching" memory device, e.g., a respective Cu—, Ag—, Au—, or Zn-electrode, etc., or e.g., a W—, Ti—, Ta—, TiN— electrode, etc., and/or for carrying out respective doping processes, e.g., a doping with nitrogen, etc. For instance, as is illustrated in FIG. 2, the sputter deposition apparatus 1 might be used to e.g., first build a respective W-layer 14a used as first electrode of a respective "resistive" or "resistively switching" memory device, and/or a respective GeSe matrix layer 14b used as "switching active" material of the memory device, and/or—thereafter—a respective Ag-doping layer 14c used as second electrode of the memory device.

In the present embodiment, advantageously, the deposition apparatus 1 is built in the form of a rf, dc magnetron co-sputter deposition device, e.g., in the form of a rf, dc co-sputter deposition device with an excitation frequency rf of e.g., 13.56 MHz (or e.g., 27.12 MHz, etc.).

As is illustrated in FIG. 1, in the sputter deposition apparatus 1, atoms/molecules in a solid "target material" 2 (here: e.g., provided in respective co-sputter targets provided on the top of the apparatus 1) are ejected into the gas phase due to bombardment of the material 2 by e.g., energetic ions, and then deposited on a substrate/wafer (here: a substrate/wafer provided on a substrate holder 4 at the bottom of the apparatus 1). The ions for the sputtering are e.g., supplied by a plasma 3 generated in the sputter deposition apparatus 1.

In the present embodiment, the sputter deposition apparatus 1 is built "top-down", with the "target material" 2 and corresponding sputter cathodes being disposed above the substrate holder 4.

As can be seen from FIG. 1, there is an angle α of e.g., between 15° and 35°, e.g., between 20° and 30°, for instance, about 25° between a plane A on which the target material 2/sputter target is provided and a plane B on which the substrate 4 is provided.

The distance between the target material 2/sputter target and the substrate holder 4 is between e.g., 15 cm and 30 cm, preferably e.g., between 20 cm and 25 cm.

Further, the distance between the plasma 3, and the target material 2/sputter target (or the distance between respective gas inlets for the plasma 3 formed in the wall 7 of the sputter deposition apparatus 1, and the target material 2/sputter target) is relatively small, e.g., between 3 cm and 15 cm, preferably e.g., between 5 cm and 10 cm.

The wall 7 of the sputter deposition apparatus 1 basically has the shape of a cylinder. The inner diameter of the cylinder is about between 45 cm-70 cm, preferably e.g., between 55 cm and 60 cm.

As substrate, a relatively big wafer might be used, e.g., a wafer with a diameter of e.g., more than 15 cm or 25 cm, e.g., between 20 cm and 60 cm, preferably e.g., between 30 cm and 50 cm.

As will be described in further detail below, in the sputter deposition apparatus 1, an additional—preferably inductively coupled—plasma 5 is provided for (or several additional plasmas).

The distance between the additional plasma 5, and the substrate holder 4 (or more exactly, the distance between respective additional gas inlets for the additional plasma 5 e.g., formed in the wall 7 of the sputter deposition apparatus 1, and the substrate holder 4) is relatively small, e.g., between 2 cm and 15 cm, preferably e.g., between 3 cm and 10 cm, e.g., between 5 cm and 8 cm.

The additional gas inlets in the wall 7 of the sputter deposition apparatus 1 (and/or optional further gas inlets 8 in the wall 7 of the sputter deposition apparatus 1, as described in more detail below) may form a respective ring around the wall 7 of the sputter deposition apparatus 1. As can be seen from FIG. 1, there is an angle β of between 15° and 35°, e.g., between 20° and 30°, for instance, about 25° between a plane D on which the additional gas inlets/the main axis of the additional plasma 5 is provided (and also a plane C on which the ring of further gas inlets 8 is provided), and the plane B on which the substrate/wafer is provided. The angle β preferably is substantially identical to the above angle α between the plane A on which the sputter target is provided and the plane B on which the substrate holder 4 is provided.

The additional plasma 5 preferably is a "ECWR" plasma (ECWR plasma=Electron Cyclotron Wave Resonance Plasma), e.g., as described in H. Neuert, Z. Naturforschung 3a, 1948, page 310, O. Sager, Z. Angew. Phys. 31, 1971, page 282, or H. Oechsner, Z. Phys. 238, 1970, page 433.

As will be described in further detail below, the (optional) further gas inlets 8 in the wall 7 of the sputter deposition apparatus 1 may be coupled with a respective additional anode ring 6, located between the additional plasma 5, and the substrate holder 4.

The additional ECWR plasma 5 might be subjected to a (preferably variably adjustable) pressure, e.g., a "normal" or relatively low pressure of about $1\text{-}8\times10^{-3}$ mbar (e.g., $3\text{-}6\times10^{-3}$ mbar), or a relatively high pressure of about $8\times10^{-3}\text{-}1\times10^{-1}$ mbar (e.g., $1\text{-}10\times10^{-2}$ mbar), etc.

The ECWR plasma 5 might serve to support the incorporation of e.g., Ag dopants into e.g., the GeSe/GeS matrix, and/or N2 into the GST matrix, etc., e.g., by means of:

(a) ion beams; and/or
(b) electrons/thermal heating; and/or
(c) photo dissolution, e.g., via UV-radiation.

In one embodiment, the sputter deposition apparatus 1 is adapted such that any of the above methods (a), (b), or (c) might be selected for use, or any possible combination thereof. For instance, the sputter deposition apparatus 1 preferably is adapted such that—alternatively—e.g., method (a), or method (b), or method (c), or a combination of the methods (b) and (c) (or a combination of the methods (a) and (b), or (a) and (c), or a combination of the methods (a), (b) and (c)) might be selected for use, whereby preferably also in the case of a combined use of methods (b) and (c), or (a) and (b), or (a) and (c), or (a) and (b) and (c) the degree in which a respective method is used might be variably adapted.

Through the ECWR plasma 5, and as illustrated in FIG. 2, the respective sputter material—e.g., Ag, and/or N2 etc., etc.—might additionally be excited or dissociated or ionized (e.g., by the above ECWR plasma ions and/or electrons and/or photons). Thereby, for instance a more dense sputter material and/or a more homogeneous deposition of the sputter material in the respective substrate material, e.g., GeSe, GeS, etc. might be achieved.

By use of the above anode ring 6—which preferably selectively might be subjected to a variably adjustable positive voltage—plasma electrons from e.g., preferably the ECWR plasma 5 might be driven towards the anode ring 6. Thereby, the lower intensity of the plasma radiation in regions close to the wall 7 of the sputter deposition apparatus 1 (i.e., in peripheral regions) might be compensated for (so as to e.g., achieve an homogeneous bombardment of the substrate with electrons). Further, especially in the case that the anode ring 6 is located relatively close to the substrate holder 4 (e.g., closer than e.g., 6 cm, preferably closer than 5 cm or 3 cm to the substrate holder 4), by applying a respectively chosen positive voltage to the anode ring 6, the bombardment of the substrate with electrons from the additional plasma 5 in total might variably be modified, e.g., reduced—for instance to almost 0, if a relatively high positive voltage is applied to the anode ring 6. Hence, in this case it might be achieved that the doping of material, e.g., Ag into the substrate (e.g., GeSe, GeS, etc.) is primarily based on plasma photons.

As will be described in further detail below, by use of the above (optional) further gas inlets 8 coupled with the anode ring 6, selectively a further additional plasma 13 (auxiliary plasma) might be generated (whereby again the sputter deposition apparatus 1, e.g., might be adapted such that any of the above methods (a), (b), or (c) might be selected for use, or any possible combination thereof (with the degree in which a respective method is used being variably adaptable)).

For supporting of the above auxiliary plasma 13, a respective rare gas/reactive gas, e.g., N2 might be let through the further gas inlets 8 coupled with the anode ring 6 into the sputter deposition apparatus 1, which is correspondingly dissociated/excited. The above auxiliary plasma 13 might e.g., be used for compensating the above lower plasma intensity in regions close to the wall 7 of the sputter deposition apparatus 1 (i.e., in peripheral regions).

Further, by the use of a suitable reactive gas, e.g., a respective sulfur-having reactive gas, e.g., the following effect might be achieved: In the above sputter target, the target material 2 may include several different components. However, the respective different components of the target material 2 on their way to the substrate—to a different degree—might be subjected to a respective scattering. Scattering losses of those components which are scattered to a relatively high degree (e.g.,: sulfur) are higher, than scattering losses of those components which are scattered to a relatively low degree (e.g., germanium). Therefore, the composition of the material deposited in the substrate might differ from the composition of the target material 2, and therefore, from the desired composition. Hence, by the above reactive gas let through the above further gas inlets 8 coupled with the anode ring 6 having one or several of the above components of the target material 2 subjected to scattering to a relatively high degree, the above different scattering losses might be compensated for. Thereby, it might be achieved that the composition of the material deposited in the substrate is substantially equal to the composition of the target material 2, and/or is substantially equal to the respective desired composition.

In addition, the target material 2 itself right from the beginning may not include the desired composition (or more exactly: the composition desired for the material to be deposited in the substrate)—for instance because a respective target material 2 would be too expensive, or may not be fabricated at all. For instance, GeS may be available as target material 2, however, not GeS2. A component completely missing in the target material, and/or a component not being present in the target material 2 to a sufficient degree (e.g.,: sulfur) might be "added" by use of the above reactive gas let through the above further gas inlets 8 coupled with the anode ring 6. If the respective reactive gas includes one or several components not included in the target material 2, but to be deposited in the substrate, and/or one or several components not included in the target material 2 to a sufficient degree, it might be achieved that the composition of the material deposited in the substrate is substantially equal to the respective desired composition (e.g., GeS2 might be deposited, even though GeS is used as target material 2).

As target material 2, any suitable material might be used, e.g., a respective chalcogenide or chalcogenid compound material, for instance an Ge—Sb—Te ("GST") or an Ag—In—Sb—Te compound material (or GeSe, GeS, AgSe, CuS, etc.) (and/or e.g., Cu, Ag, Au, Zn, W, Ti, Ta, TiN, etc., etc.). In particular, in the case of carrying out a respective co-sputtering process, two different target materials might be used simultaneously, e.g., GeS (or e.g., Se) and Ag2S (or AgSe), etc.

Figure 3A:
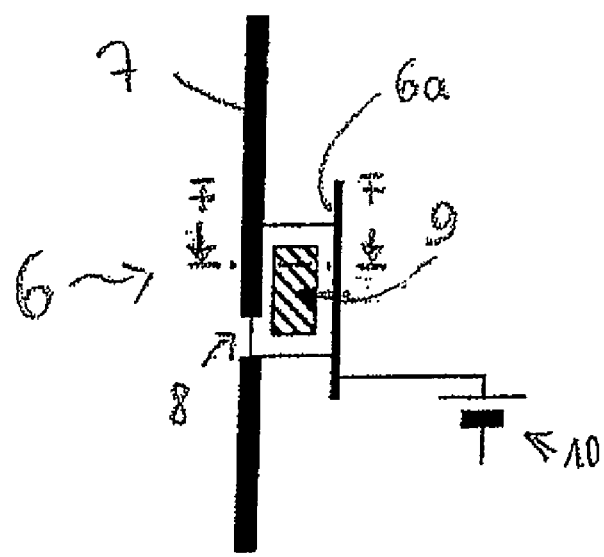
FIG. 3a illustrates a schematic cross-sectional view of the anode ring of the sputter deposition apparatus illustrated in FIG. 1, and respective permanent magnets.

FIG. 3a illustrates a schematic cross-sectional view of the anode ring 6 of the sputter deposition apparatus 1 illustrated in FIG. 1, and of the above (optional) further gas inlets 8 in the wall 7 of the sputter deposition apparatus 1.

The wall 7 of the sputter deposition apparatus 1 preferably is non-magnetic, and for this purpose e.g., might include a respective non-metallic material, e.g., a respective ceramic material.

As already mentioned above, through the further gas inlets 8 a respective rare gas/reactive gas, e.g., N2 may be let into the sputter deposition apparatus 1.

Figure 3B:
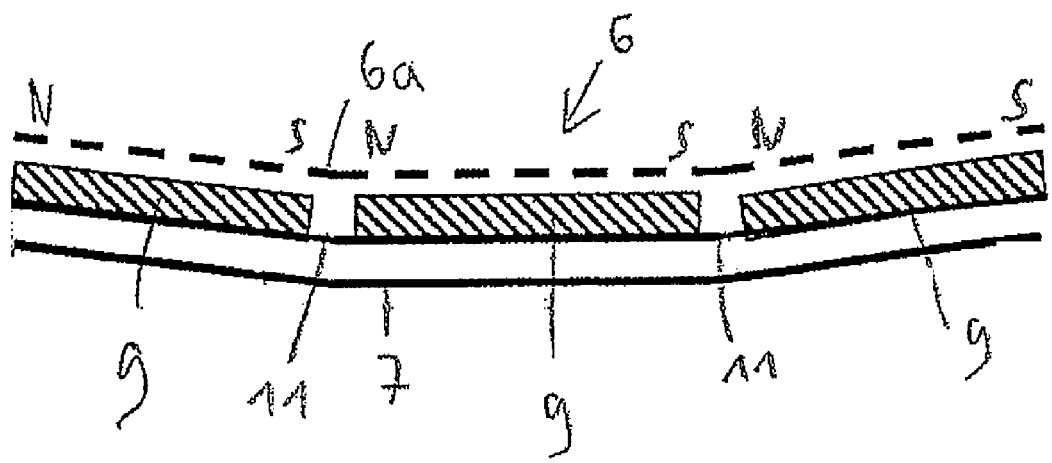
FIG. 3b illustrates a schematic longitudinal sectional view of the anode ring of the sputter deposition apparatus illustrated in FIG. 1, and respective permanent magnets.

The above positive voltage to which the above anode ring 6 might be subjected to might be provided by a respective voltage source 10 electrically in contact with the anode ring 6. As can be seen from FIG. 3a, between the anode ring 6 (or an inner wall 6a of the anode ring in the case that the anode ring as illustrated in FIG. 3a is built in the form of a box), and the wall 7 of the sputter deposition apparatus 1, several permanent magnets 9 might be provided. The permanent magnets 9 e.g., each might be of rectangular cross section, and/or of rectangular longitudinal section, and each might be of substantially the same size. Preferably, the anode ring 6 or the above inner wall 6a of the anode ring is built from a respective non-magnetic material, and as is illustrated in FIG. 3b is perforated such as to allow the rare gas/reactive gas let through the further gas inlets 8 to enter inner regions of the sputter deposition apparatus 1.

As can be seen from FIG. 3a, the further gas inlets 8 are provided at the wall 7 of the sputter deposition apparatus 1 at a distance from the substrate holder 4 which is substantially identical to the distance between the permanent magnets 9 and/or the anode ring 6, and the substrate holder 4.

The permanent magnets 9 may be coupled by a respective additional ring 11 or metal plate 11 provided inside the sputter deposition apparatus 1 between the permanent magnets 9, and the wall 7 of the sputter deposition apparatus 1. Preferably, the additional ring 11 may be built from a respective magnetic material, e.g., nickel, or iron. Hence, a magnetic short cut between adjacent permanent magnets 9 might be achieved—more specifically, a magnetic short cut between the south pole (S) of a first permanent magnet 9, and the north pole (N) of a second permanent magnet 9 adjacent to one side of the first permanent magnet 9, and additionally a magnetic short cut between the north pole (N) of the first permanent magnet 9, and the south pole (S) of a third permanent magnet 9 adjacent to the other side of the first permanent magnet 9, etc., etc.

By use of the permanent magnets 9, a respective magnetic constant field might be produced, e.g., a magnetic constant field with a field strength of between e.g., 1500-15000 Å/m, in particular, between 3000-10000 Å/m (e.g., around 7000 Å/m).

Figure 3C:
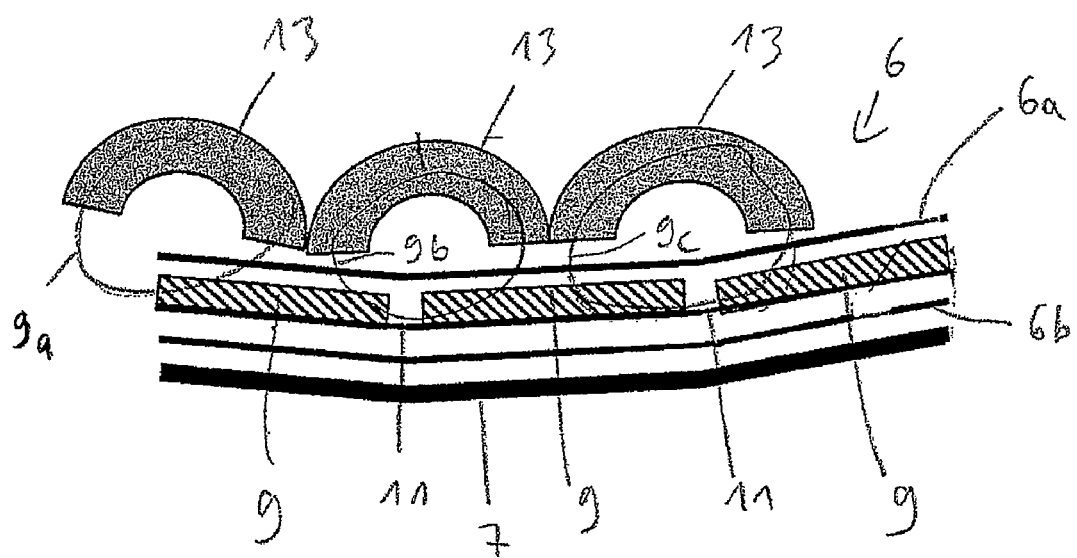
FIG. 3c illustrates a more detailed longitudinal sectional view of the anode ring of the sputter deposition apparatus illustrated in FIG. 1, and respective permanent magnets.
Figure 4:
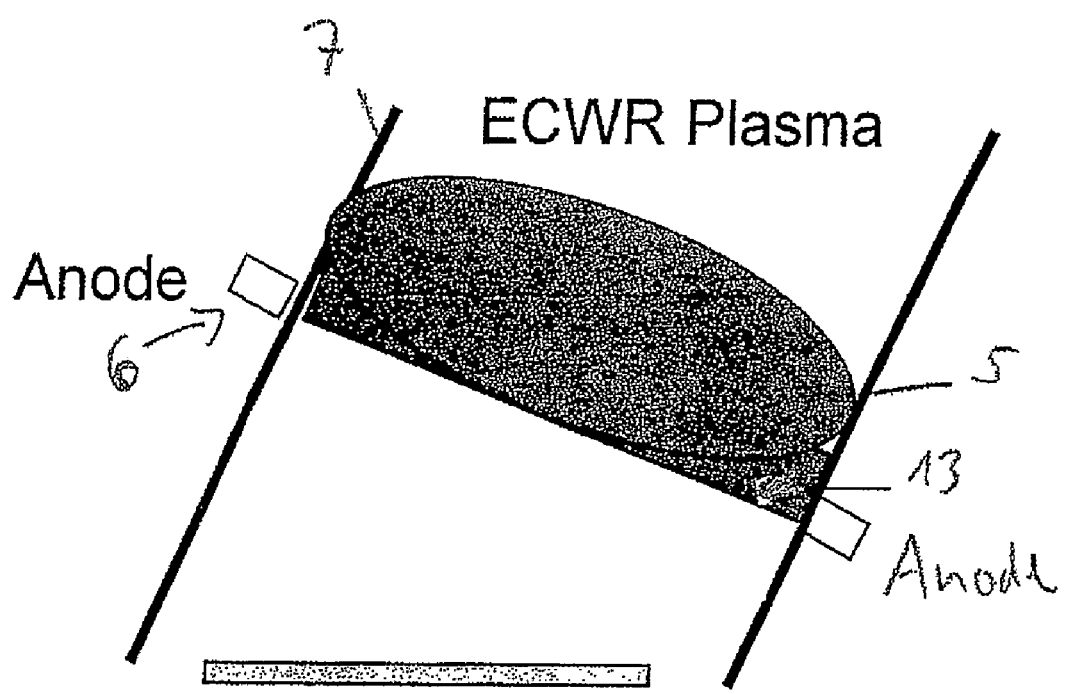
FIG. 4 illustrates a schematic representation of the ECWR plasma and the auxiliary plasma generated in the sputter deposition apparatus illustrated in FIG. 1.

FIG. 3c illustrates a more detailed longitudinal sectional view of the anode ring 6 of the sputter deposition apparatus 1, and the permanent magnets 9. In particular, FIG. 3c illustrates respective lines 9a, 9b, 9c illustrating the magnet flux between adjacent permanent magnets 9, and the anode plasma (auxiliary plasma) 13 produced by use of the anode ring 6 with the above further gas inlets 8. As can be seen in FIG. 4, the auxiliary plasma 13 basically has a cylinder-symmetrical form, and has a higher intensity in regions close to the wall 7 of the sputter deposition apparatus 1 (i.e., in peripheral regions), than in inner regions of the apparatus 1. In contrast, the ECWR plasma 5 has a lower intensity in regions close to the wall 7 of the sputter deposition apparatus 1, i.e., in peripheral regions, than in inner regions of the apparatus 1. In other words, the ECWR plasma 5 is modified by the auxiliary plasma 13 such as to e.g., achieve a more homogeneous bombardment of the substrate 4 with electrons/ions/photons.

The substrate holder 4 might be rotateable, and might be floating, or might be capacitively coupled via a respective matching network 16 to a rf transmitter 15 with a (e.g., variable) excitation frequency rf of between 5 and 40 MHz, e.g., 13.56 MHz (or e.g., 27.12 MHz, etc.), and/or a (e.g., variably adjustable) power, such that at the substrate holder 4 e.g., an effective bias voltage Veff of between e.g., 5V-70V might be achieved, for instance a relatively low effective voltage of e.g., between 10V-20V, or a relatively high effective voltage of e.g., between 40V-60V, etc.

By use of a relatively high excitation frequency, e.g., 27.12 MHz instead of 13.56 MHz, the bombardment of the substrate with ions in relation to the bombardment with e.g., electrons might be reduced; the dissolution then e.g., primarily might be based on bombardment with electrons. Correspondingly similar, by use of a relatively low excitation frequency, e.g., 13.56 MHz instead of 27.12 MHz, the bombardment of the substrate 4 with electrons in relation to the bombardment with e.g., ions might be reduced; the dissolution then e.g., might be based to a substantially corresponding degree on both bombardment with ions, and on bombardment with electrons (or e.g., primarily might be based on bombardment with ions, etc., etc.). By applying the above relatively low effective voltage Veff (e.g., between 10V-20V) to the substrate holder 4 (leading to a relatively high degree of bombardment of the substrate with electrons in relation to the bombardment with e.g., ions), in addition to a respective sputtering, an etching with a relatively high etch rate might be achieved. Correspondingly similar, by applying the above relatively high effective voltage Veff (e.g., between 40V-50V) to the substrate holder 4 (leading to a relatively high degree of bombardment of the substrate with ions in relation to the bombardment with e.g., electrons), in addition to a respective sputtering, an etching with a relatively low etch rate might be achieved, and/or an etching primarily based on ions.

Figure 5:
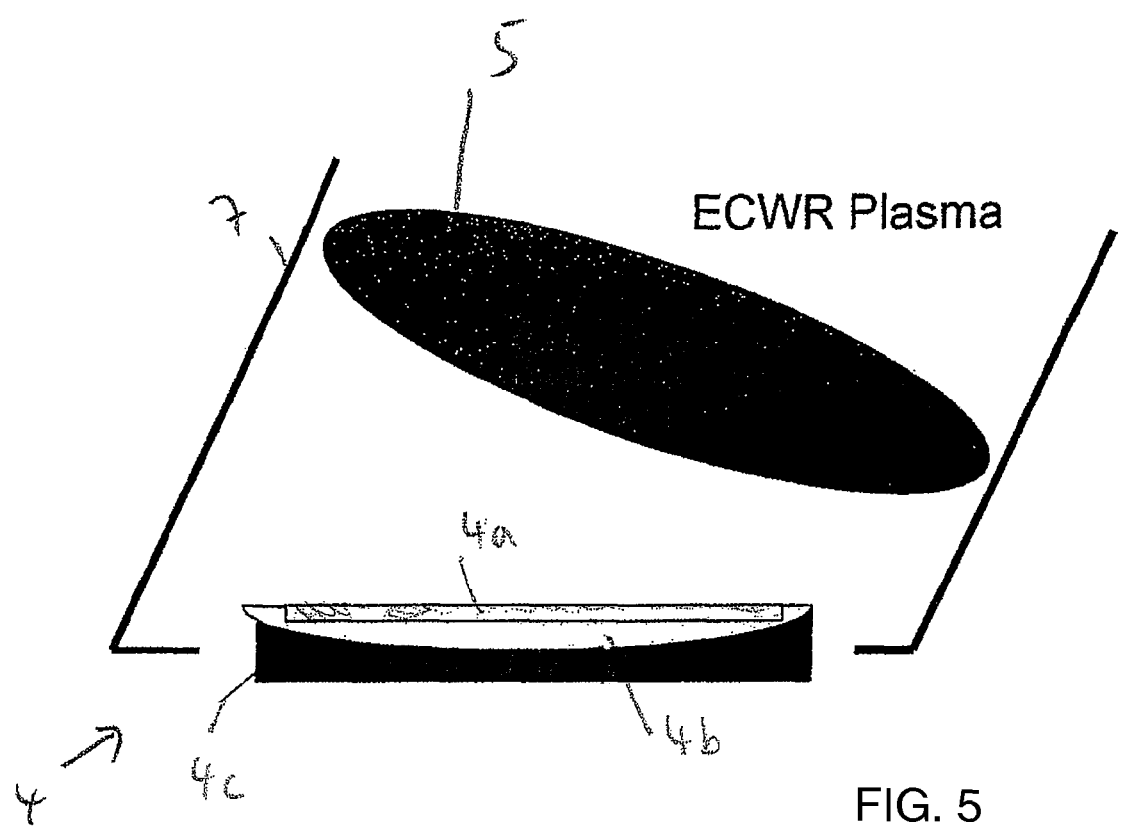
FIG. 5 illustrates a schematic detail representation of the ECWR plasma and the substrate holder used in the sputter deposition apparatus illustrated in FIG. 1.
Figure 6:
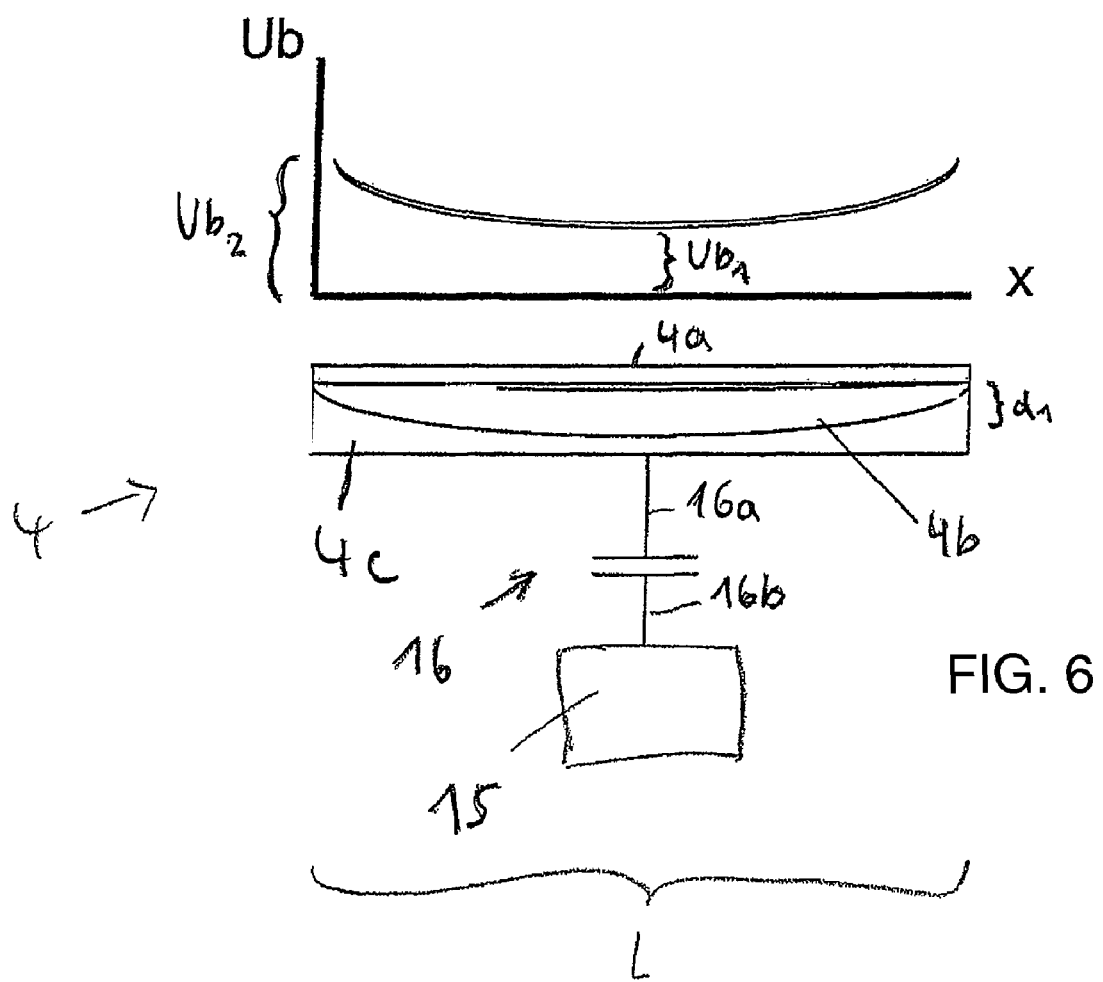
FIG. 6 illustrates a schematic representation of the bias voltage distribution achievable with the substrate holder of the sputter deposition apparatus illustrated in FIG. 1.

As is illustrated in FIGS. 5 and 6, the substrate holder 4 includes a respective metallic plate 4a (i.e., a layer on which the respective sputtering/deposition/doping/etching, etc. is to take place), a shaped metallic corpus 4c, and—as will be described in further detail below—a dielectric layer 4b provided between the metallic corpus 4c, and the plate 4a.

The metallic corpus 4c can be capacitively coupled to the above rf transmitter 15, if necessary. For this purpose, a respective coupling point of the corpus 4c is connected via a line 16a with the above matching network 16, which via a line 16b is connected with the rf transmitter 15. As is apparent from FIG. 4, the coupling point of the metallic corpus 4c e.g., may be located at the center of the corpus 4c.

The dielectric layer 4b may be built from a respective homogenous ceramic material, e.g., a respective titanate.

As is illustrated in FIGS. 5 and 6, the dielectric layer 4b at peripheral regions of the substrate holder 4 is thinner than at inner regions of the substrate holder 4. For instance, the maximum thickness d1 of the dielectric layer 4b below the center of the plate 4a may be more than 10%, in particular more than 20%, e.g., more than 30% higher (e.g., between 15%-40% higher), than the minimum thickness of the dielectric layer 4b at regions below the outer rim of the plate 4a. Thereby, e.g., inhomogeneities of the bias voltage Ub at the plate 4a might be compensated for. Such inhomogeneities might e.g., occur when the wave length corresponding to the above rf excitation frequency (or half or a quarter of the wave length) is substantially of the same magnitude, or is substantially similar to the length 1 of the substrate holder 4. If so—without the above differences in the thickness of the dielectric layer 4b—in a region close to the coupling point of the corpus 4c, a different bias voltage might occur, than e.g., in peripheral regions of the substrate holder 4. Hence, the differences in the thickness of the dielectric layer 4b may e.g., be chosen such as to substantially compensate such inhomogeneities of Ub at the plate 4a. Alternatively, as is illustrated in FIG. 6, the differences in the thickness of the dielectric layer 4b may e.g., be chosen such that at peripheral regions of the substrate holder 4, a higher bias voltage Ub might be achieved, than at inner regions of the substrate holder 4. For instance, the differences in the thickness of the dielectric layer 4b may e.g., be chosen such that the maximum bias voltage Ub2 at outer rim regions of the plate 4a may be more than 10%, in particular more than 20%, e.g., more than 30% higher (e.g., between 15%-40% higher), than the minimum bias voltage Ub1 at the center of the plate 4a. Due to the higher bias voltage Ub at the peripheral regions of the plate 4a than at the inner regions of the plate 4a, the attractive force applied on respective plasma ions, plasma electrons, etc. is higher at the peripheral regions of the plate 4a, than at the inner regions of the plate 4a. Hence, the above lower intensity of the plasma radiation in regions close to the wall 7 of the sputter deposition apparatus 1 (i.e., in peripheral regions) might be compensated for. Therefore, again, a substantially homogeneous bombardment (with electrons, ions) of the substrate, i.e., e.g., the GeSe/GeS or GST matrix might be achieved, leading to a respective doping/etching of the matrix.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A sputter deposition apparatus, comprising:
   at least one sputter target provided on a first plane;
   a first plasma;
   a substrate holder provided on a second plane, the substrate holder comprising a metallic corpus having a continuously varying thickness;
   a further plasma;
   an anode ring located between the first plasma and the substrate holder; and
   a plurality of permanent magnets arranged in a ring and aligned and within the anode ring,
   wherein an angle between the second plane and the first plane is between 15° and 35°.

2. The sputter deposition apparatus of claim 1, wherein the further plasma is an ECWR plasma.

3. The sputter deposition apparatus of claim 2, wherein the ECWR plasma is located closer to the substrate holder, than the first plasma.

4. The sputter deposition apparatus of claim 2, wherein the distance between the ECWR plasma and the substrate holder is less than 15 cm.

5. The sputter deposition apparatus of claim 2, wherein the distance between the ECWR plasma and the substrate holder is less than 10 cm.

6. The sputter deposition apparatus of claim 3, additionally comprising an auxiliary plasma.

7. The sputter deposition apparatus of claim 6, wherein the auxiliary plasma is located closer to the substrate holder, than the ECWR plasma.

8. The sputter deposition apparatus of claim 3, wherein the anode ring is provided between the ECWR plasma and the substrate holder.

9. The sputter deposition apparatus of claim 6, wherein the auxiliary plasma has a higher intensity in peripheral regions of the sputter deposition apparatus, than in inner regions of the sputter deposition apparatus.

10. The sputter deposition apparatus of claim 1, the substrate holder comprising a dielectric layer with varying thickness.

11. The sputter deposition apparatus of claim 10, wherein a maximum thickness of the dielectric layer is more than 15% higher, than a minimum thickness of the dielectric layer.

12. The sputter deposition apparatus of claim 11, wherein a region of the dielectric layer comprising the maximum thickness is located substantially at the center of the dielectric layer.

13. The sputter deposition apparatus of claim 12, wherein a region of the dielectric layer comprising the minimum thickness is located at the periphery of the dielectric layer.

14. The sputter deposition apparatus of claim 10, additionally comprising a transmitter coupled with the substrate holder.

15. The sputter deposition apparatus of claim 14, the transmitter and a matching network inducing a bias voltage at the substrate holder which due to the varying thickness of the dielectric layer is higher at a peripheral region of the substrate holder, than at an inner region of the substrate holder.

16. The sputter deposition apparatus of claim 15, wherein a maximum bias voltage at the peripheral region is more than 15% higher, than a minimum bias voltage at the inner region.

17. A sputter deposition method, comprising:
    generating a first plasma;
    generating a second plasma located between the first plasma and a substrate on a substrate holder, the substrate holder comprising a dielectric layer with varying thickness provided on a metallic corpus having a continuously varying thickness;
    driving electrons from the second plasma towards an anode ring; and
    generating a substantially constant magnetic field via a plurality of permanent magnets arranged in a ring and aligned and within the anode ring.

18. The method of claim 17, wherein the second plasma is an ECWR plasma.

19. The method of claim 17, further comprising:
    applying a voltage to the anode ring, the anode ring provided between the second plasma and the substrate.

20. The method of claim 17, further comprising:
    depositing material for a resistively switching memory device.

21. The method of claim 20, wherein the memory device is a Phase Change Random Access Memory.

22. The method of claim 20, wherein the memory device is a Conductive Bridging Random Access Memory.

23. A sputter deposition apparatus comprising:

at least one sputter target;

means for providing a first plasma;

means for providing a substrate holder comprising a dielectric layer with varying thickness provided on a metallic corpus having a continuously varying thickness;

means for providing a further plasma;

an anode ring located between the first plasma and the substrate holder; and a plurality of permanent magnets arranged in a ring and aligned and within the anode ring.

24. A sputter deposition method for forming an integrated circuit, comprising:

positioning a substrate on a substrate holder provided on a first plane, the substrate holder comprising a metallic corpus having a continuously varying thickness;

positioning a target material on a second plane within a sputtering chamber, an angle between the first plane and the second plane between 15° and 35°;

generating a first plasma within the sputtering chamber between the target material and the substrate;

bombarding the target material with ions of the first plasma to eject atoms from the target material for deposition on the substrate;

generating a second plasma within the sputtering chamber between the first plasma and the substrate;

driving electrons from the second plasma towards an anode ring; and generating a substantially constant magnetic field via a plurality of permanent magnets arranged in a ring and aligned and within the anode ring.

25. The method of claim 24, wherein the second plasma comprises an electron cyclotron wave resonance plasma.

26. The method of claim 24, wherein the second plasma comprises an inductively coupled plasma.

27. The method of claim 24, including bombarding the target material with ions of the second plasma to eject further atoms from the target material for deposition on the substrate.

28. The method of claim 24, including subjecting the second plasma to an adjustable pressure.

29. The method of claim 24, including:

positioning the anode ring about a perimeter of the sputtering chamber between the second plasma and the substrate, and applying an adjustable voltage to the anode ring to direct electrons from the second plasma to bombard the substrate for deposition thereon.

30. The method of claim 29, wherein the sputtering chamber is cylindrical in shape.

31. The method of claim 29, including varying the voltage to control the number of electrons from the second plasma bombarding the substrate.

32. The method of claim 29, including providing one or more desired dopants in the second plasma such that the desired dopants are deposited on the substrate.

33. The method of claim 29, including generating an auxiliary plasma between the second plasma and the substrate.

34. The method of claim 33, further including generating the substantially constant magnetic field about a perimeter of the sputtering chamber such that the auxiliary plasma has a higher intensity about the perimeter region of the sputtering chamber than inner regions of the sputtering chamber, wherein the adjustable voltage applied to the anode ring directs electrons from the auxiliary plasma to bombard peripheral regions of the substrate for deposition thereon.

35. The method of claim 34, including providing one or more desired dopants in the second plasma such that the desired dopants are deposited on the substrate.

36. The method of claim 24, providing a dielectric layer of varying thickness on the substrate holder to control a bias voltage across the substrate holder.

37. The method of claim 36, including providing the dielectric layer such that the dielectric layer is thinner at peripheral regions than at center regions of the substrate holder.

38. The method of claim 36, including providing the thickness of the dielectric layer such that the bias voltage is substantially uniform across the substrate holder.

39. The method of claim 36, including providing the thickness of the dielectric layer such that the bias voltage is higher at peripheral regions than at a center regions of the substrate holder.

40. The method of claim 24, wherein the integrated circuit comprises a resistively switching memory device.

41. A sputter deposition apparatus, comprising:

at least one sputter target provided on a first plane;

a first plasma;

a substrate holder provided on a second plane, the substrate holder comprising a metallic corpus having a continuously varying thickness and a dielectric layer with a varying thickness;

a transmitter coupled to the substrate holder, the transmitter and a matching network inducing a bias voltage at the substrate holder which due to the varying thickness of the dielectric layer is higher at a peripheral region of the substrate holder than at an inner region of the substrate holder;

a ECWR plasma located closer to the substrate holder than the first plasma;

an auxiliary plasma located closer to the substrate holder than the ECWR plasma, the auxiliary plasma having a higher intensity in peripheral regions of the sputter deposition apparatus than in inner regions of the sputter deposition apparatus;

an anode ring located between the ECWR plasma and the substrate holder;

an adjustable voltage source coupled to the anode ring; and a plurality of permanent magnets arranged in a ring and aligned and within the anode ring, wherein an angle between the second plane and the first plane is between 15° and 35°.

42. The sputter deposition apparatus of claim 41, wherein the anode ring is perforated.

* * * * *